(12) United States Patent
Wang

(10) Patent No.: US 6,594,073 B2
(45) Date of Patent: Jul. 15, 2003

(54) ANTISTATIC OPTICAL PELLICLE

(75) Inventor: Ching-Bore Wang, Fremont, CA (US)

(73) Assignee: Micro Lithography, Inc., Sunnyvale, CA (US)

( * ) Notice: Subject to any disclaimer, the term of this patent is extended or adjusted under 35 U.S.C. 154(b) by 0 days.

(21) Appl. No.: 09/870,730

(22) Filed: May 30, 2001

(65) Prior Publication Data

US 2002/0181092 A1 Dec. 5, 2002

(51) Int. Cl.$^7$ .................................................. G02B 5/08
(52) U.S. Cl. ...................... 359/350; 359/359; 359/360; 430/5
(58) Field of Search ................................. 359/350, 359, 359/360, 361; 430/5

(56) References Cited

U.S. PATENT DOCUMENTS

| | | |
|---|---|---|
| 4,759,990 A | 7/1988 | Yen |
| 5,339,197 A | 8/1994 | Yen |
| 5,577,610 A | 11/1996 | Okuda et al. |
| 5,674,624 A | 10/1997 | Miyazaki et al. |
| 6,337,161 B2 * | 1/2002 | Chiba et al. .................. 428/14 |

FOREIGN PATENT DOCUMENTS

JP      10-328012      11/1998

* cited by examiner

Primary Examiner—John Juba
Assistant Examiner—Fayez Assaf
(74) Attorney, Agent, or Firm—Kolisch Hartwell, P.C.

(57) ABSTRACT

An antistatic pellicle for use with deep-ultraviolet light. The pellicle is coated with a thin metal oxide layer that has high transmissivity for deep-ultraviolet light and an electrical resistivity low enough to minimize electrostatic discharge. The metal oxide layer may be produced by a sol-gel process using a reactive polyvalent metal sol-precursor. The sol-precursor is converted to a sol, the sol is applied to a membrane so that it produces a gel on a surface of the membrane, and then the gel is dried to a coating.

33 Claims, 1 Drawing Sheet

US 6,594,073 B2

ANTISTATIC OPTICAL PELLICLE

FIELD OF THE INVENTION

The invention relates to optical pellicles. More specifically the invention relates to optical pellicles that include an electrically conductive coating.

BACKGROUND OF THE INVENTION

Integrated circuits are produced through the process of photolithography. Photolithography frequently employs ultraviolet light (UV) to reproduce a photomask or reticle pattern on a substrate, such as a silicon wafer. The photomask blocks transmission of a patterned portion of the incident light, allowing the inverse pattern to be focused on a photosensitive surface of the substrate. This optical process, followed by development of a positive or negative pattern on the substrate, facilitates creation of an integrated circuit. Superposition of related patterns through repetition of this process with multiple photomasks results in a multi-layered integrated circuit on the substrate.

Accurate reproduction of the photomask pattern on the substrate is critical to production of a functional microcircuit. Therefore, the integrity of the photomask must be protected to allow repeated use. Small particles, such as airborne dust or fibers, are a significant source for degrading the accuracy of photomask pattern reproduction. Even very small particles can alter light transmission when positioned near the focal plane of the photomask. As a result, these particles can produce defects in the microcircuit.

To protect the integrity of the photomask pattern, an optical pellicle is used. The optical pellicle includes a thin, uniform membrane. Typically, the optical pellicle is supported above the photomask surface by a frame. The membrane acts as a dust cover that is capable of keeping particles away from the surface of the photomask. Instead, particles are collected on the pellicle surface, at a distance from the photomask generally determined by the height of the frame. These particles are positioned relatively distant from the photomask focal plane, so that the ability of the particles to block light transmission to the photomask is significantly mitigated.

An effective optical pellicle is capable of very efficient transmission of incident radiation, with little distortion. To achieve these optical properties, pellicles are generally constructed of a material that absorbs very little light at the wavelength of light selected for the photolithographic process. This high transmissivity is coupled with a uniform thickness, in the range of approximately 0.5 $\mu$m to 2 $\mu$m. When sources that produce UV light of longer wavelengths are used in photolithography, nitrocellulose or cellulose acetate provides pellicle membranes with high transmissivity, but also require an anti-reflective coating due to the relatively high refractive index of these materials.

The wavelength of electromagnetic radiation used in the photolithographic process is directly related to the minimum feature size of the circuit produced on the substrate. Therefore, efforts to increase the density of the circuitry on microchips has caused photolithography to evolve from the use of mercury lamp g-line and i-line output at 436 nm and 365 nm towards deep-UV and vacuum-UV regions of the ultraviolet spectrum. The predominant spectral output of a mercury lamp occurs in the mid- to near-UV region. Thus the fabrication industry has turned to excimer lasers to produce microcircuits using radiation from the deep-UV region. For example, Krypton Fluoride (KrF) lasers produce UV radiation of 248 nm, whereas Argon Fluoride (ArF) lasers emit at 193 nm. For purposes of the present invention, deep-UV is defined as ultraviolet light with a wavelength less than 250 nm.

Fabrication of microcircuits through photolithography in the deep-UV region requires an optical pellicle with low absorption of this ultraviolet radiation. Fluoropolymers have been found to have the desired properties at 248 nm and 193 nm. Specifically, most effective polymers are amorphous, fluorine-containing polymers, and more specifically perfluoro amorphous resins, such as those described in U.S. Pat. No. 5,674,624 issued to Miyazaki et al, which is hereby incorporated by reference. Membranes constructed from commercially available fluoropolymer resins have been used successfully. For example, the fluoropolymers CYTOP from Asahi Glass and AF-1600 from DuPont have been found to be suitable. Pellicles constructed with these fluoropolymers show high transmissivity in the deep-UV range, have a low enough refractive index that an anti-reflective coating is generally not required, and are sufficiently resistant to damage by ultraviolet radiation.

Although fluoropolymer membranes show desirable optical properties for photolithography, they have undesirable electrical properties. Specifically, fluoropolymers act as extremely effective insulators. In fact, fluoropolymers suitable for use in an optical pellicle have very low dielectric constants, usually a value of less than 2.0, and a volume resistivity of greater than $10^{18}$ $\Omega$-cm. The extremely effective insulating property of fluoropolymers prevents a standard fluoropolymer membrane from readily dispersing accumulated electrostatic charge. The result is a build-up of electrostatic charge on the fluoropolymer membrane, producing periodic, significant electrostatic discharge to the photomask. This electrostatic discharge is capable of degrading features of the photomask, especially with repeated electrostatic discharge. The problem of electrostatic discharge is further exacerbated by the small feature size of photomasks used in the deep-UV range. The mass of these features is frequently not sufficient to dissipate heat produced by electrostatic discharge, thus resulting in electrostatic discharge-mediated damage to the photomask. The ability of electrostatic discharge to damage photomasks results in the destruction of many thousands of photomasks every year, a substantial monetary loss to the microcircuit fabrication industry.

Efforts to minimize the effects of electrostatic discharge have focused on dissipating electrostatic charge in a clean room before and during microcircuit fabrication. For example, tools and instruments have been grounded and ionized air has been introduced into the clean room. This has lessened the impact of electrostatic charge accumulation during microcircuit fabrication but does not eliminate the effect of electrostatic discharge from outside sources.

One such outside source of electrostatic discharge is the optical pellicle itself. Because it is such an excellent insulator, the pellicle membrane may accumulate a charge when it is manufactured. Additional charge may also build up on the optical pellicle during shipping to its site of use.

Efforts to reduce charge build-up by coating fluoropolymer optical pellicles with an antistatic material have been unsuccessful, at least in part because electrically conductive materials are difficult to adhere to a surface of the fluoropolymer membrane. Therefore, the fabrication industry requires a charge dispersing material that will adhere to a deep-UV pellicle membrane to provide an antistatic pellicle.

SUMMARY OF THE INVENTION

The present invention provides an optical pellicle with an antistatic coating, and a sol-gel process for producing the coating. The coating comprises a thin, metal oxide layer that maintains high transmissivity of the optical pellicle to deep-ultraviolet light. In the sol-gel process disclosed, the thin metal oxide layer is produced by applying a sol to the pellicle membrane so that the sol is converted to a gel, and then drying the gel to a coating.

DETAILED DESCRIPTION

Figure 1:
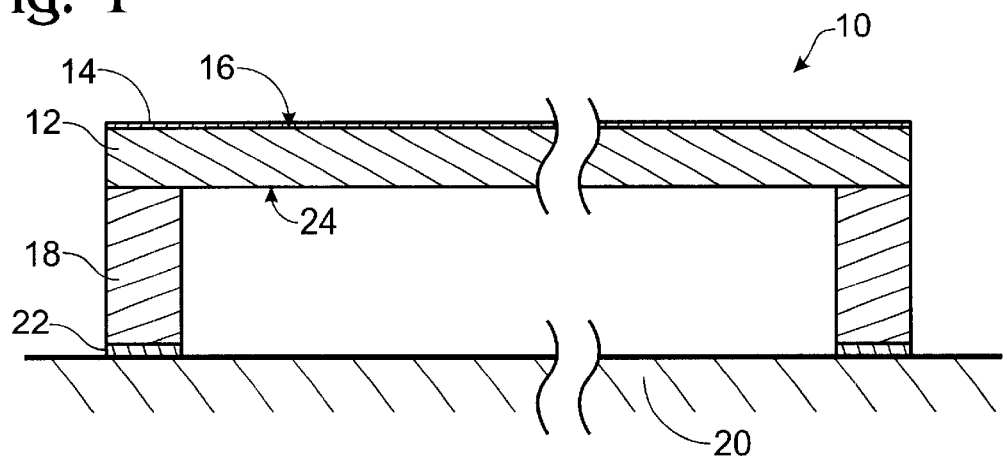
FIG. 1 is a side elevation view in cross-section of an embodiment of an optical pellicle constructed according to the present invention, with the pellicle in a working position above a photomask and including an antistatic coating disposed on the top surface of a pellicle membrane.

The present invention provides an optical pellicle that includes an antistatic coating. An embodiment of the present invention with an optical element comprising a membrane with an electrically conductive coating is depicted in FIG. 1 and identified generally with the numeral 10. The depicted optical element, referred to hereafter as an optical pellicle, includes a coating disposed on a surface of a high transmissivity membrane. The coating adheres to the membrane, and is substantially thinner than the membrane and capable of dispersing charge such that the frequency or intensity of electrostatic discharge to a photomask is reduced.

An optical pellicle 10 includes a membrane 12 with a coating 14 disposed on a surface 16 of membrane 12. Membrane is generally attached to a frame 18, which is constructed of a suitable material such as metal, ceramic or plastic. Typically the frame is constructed of aluminum. Frame 18 holds membrane 12 in a spaced relationship from a substantially planar surface of photomask 20, trapping unwanted particles and debris away from the focal plane of the photomask. Pellicle 10 is typically attached to photomask 20 with adhesive 22 that holds frame 18 in position on the photomask. By keeping the particles out of focus, their disruptive effect on the pattern produced by photolithography is minimized.

Membrane 12 is composed of any material with an ability to transmit a substantial percentage of incident electromagnetic radiation with minimal distortion. High transmissivity material absorbs a small enough proportion of incident imaging radiation to allow effective imaging of the photomask pattern on the substrate. Typically, a high transmissivity membrane absorbs less than half of incident imaging radiation, and more preferably has an average transmissivity of about 80%, 90%, or 95%. For to photolithography with deep-ultraviolet light, membrane 12 is highly transmissive for ultraviolet light at a wavelength less than 250 nm. For efficient transmission of UV light at 248 nm and 193 nm, membrane 12 may be constructed of a suitable high transmissivity fluoropolymer such as CTYOP from Asahi Glass or AF-1600 from Du Pont.

Membrane 12 has a thickness defined by practical considerations related to manufacturing, handling, and use. In general, membrane 12 may be as thin as is practicable to minimize absorption of radiation. On the other hand, membrane 12 is thick enough to facilitate production and to resist mechanical damage with normal use. Membrane 12 may have a thickness of about 0.5 $\mu$m to 2 $\mu$m, about 0.6 $\mu$m to 1.7 $\mu$m, or about 0.8 $\mu$m to 1.5 $\mu$m. In most cases, the thickness of membrane 12 is uniform to minimize optical distortion.

Figure 2:
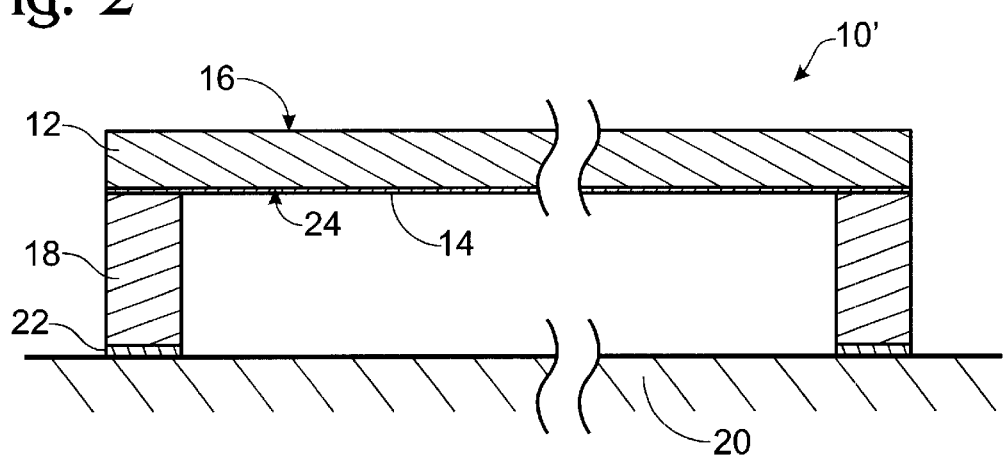
FIG. 2 is a side elevation view in cross-section of an embodiment of an optical pellicle constructed according to the present invention, with the pellicle in a working position above a photomask and including an antistatic coating disposed on the bottom surface of a pellicle membrane.
Figure 3:
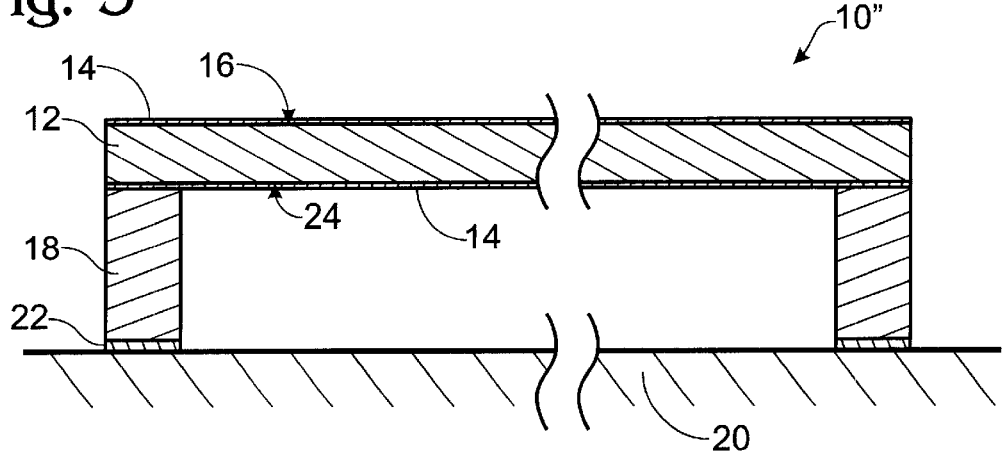
FIG. 3 is a side elevation view in cross-section of an embodiment of an optical pellicle constructed according to the present invention, with the pellicle in a working position above a photomask and including an antistatic coating disposed on the top and bottom surfaces of a pellicle membrane.

As shown in FIG. 1, top surface 16 of membrane 12 includes coating 14, which typically adheres to membrane 12 and extends substantially over at least one surface of the membrane. In this example, bottom surface 24 does not include coating 14. However, coating 14 may be included on bottom surface 24, as shown for pellicle 10' in FIG. 2, or on both top and bottom surfaces 16 and 24 as shown for pellicle 10" in FIG. 3. When coating 14 is present on bottom surface 24, the coating typically separates membrane 12 and frame 18 as shown in FIGS. 2 and 3.

Coating 14 is any electrically conductive thin layer placed on a surface of membrane 12. An electrically conductive layer is any layer that has the ability to minimize electrostatic discharge from the pellicle. An electrically conductive coating facilitates charge dispersal by acting as a conductor with weaker insulating properties, and thus superior conducting properties to membrane 12. Electrically conductive coating 14 commonly has a volume resistivity of less than about $10^{16}$ Ω-cm. More frequently, coating 14 has a volume resistivity less than about $10^8$ Ω-cm, and even more frequently less than about $10^3$ Ω-cm, or between about $10^2$ Ω-cm–$410^3$ Ω-cm.

The thickness of coating 14 is adjusted to accommodate competing considerations. The coating should have a thickness that is sufficient to disperse a static charge, but should be thin enough to maintain high transmissivity of pellicle 10. Suitable thickness is dependent upon optical transmissivity and electrical conductivity properties of coating 14 disposed on membrane 12. For example, coating 14 may be thicker if the coating material has very low absorbance of the radiation used for photolithography. Alternatively, a thinner coating may be suitable if the coating material has a low volume resistivity. Coating 14 is substantially thinner than membrane 12 and preferably has a thickness of about 20 angstroms to about 2000 angstroms, 50 angstroms to about 1000 angstroms, or about 100 angstroms to about 700 angstroms.

Coating 14 is formed substantially of molecules that contain polyvalent metal, M, in the form of an oxide. For the purposes of the present invention, metal oxides include each of the following forms. 1) Metal oxides comprise any compound in which at least part of the molecule includes n M—O bonds per metal atom, where n is the valency of metal M. 2) Metal oxides comprise a hydroxide in which at least part of the molecule includes M—OH bonds. 3) Metal oxides comprise any compound in which at least part of the molecule includes (n–k) M—O bonds per metal atom and k non-hydrolyzable organic groups per atom of the polyvalent metal M, where n is the total valency of M. 4) Metal oxides comprise any compound in which at least part of the molecule includes an atom with both an M—OH bond and a non-hydrolyzable organic group. For both (3) and (4) each non-hydrolyzable organic group is a hydrocarbon that is optionally saturated or unsaturated and substituted or unsubstituted.

A polyvalent metal, as defined for the invention, includes the metalloids silicon (Si), boron (B), germanium (Ge), arsenic (As), antimony (Sb), tellurium (Te), polonium (Po), and astatine (At), and any polyvalent metal to the left of, or below metalloids on a standard periodic table, including alkaline earth metals, transition metals, lanthanides and actinides. Examples of metals that may be suitable in the invention include the metalloids listed above and aluminum (Al), beryllium (Be), cerium (Ce), chromium (Cr), cobalt (Co), copper (Cu), erbium (Er), europium (Eu), hafnium (Hf), indium (In), iron (Fe), magnesium (Mg), nickel (Ni), niobium (Nb), palladium (Pd), praseodymium (Pr), rubidium (Rb), strontium (Sr), tantalum (Ta), thorium (Th), tin (Sn), titanium (Ti), tungsten (W), uranium (U), vanadium (V), yttrium (Y), zinc (Zn), and zirconium (Zr). Alternatively, for the present invention metals include Al, Ce, Si, Ti, or Zr; in some cases metals include Al, Si, or Ti.

Metal oxides of coating 14 may be produced by any suitable method. However, in a preferred embodiment, a sol-gel process is used. A sol-gel process may be considered as effectively comprising two steps, although these two steps may be occurring concomitantly within a reaction. In one step, a sol in produced from one or more reactive components. A sol is a colloidal suspension of solid particles that may be about 1 nm to about 1000 nm in diameter. These particles remain in suspension because they are small enough that gravitational forces become negligible and short-range interactions predominate. In a second step, the sol particles are aggregated or interlinked to form a gel, which is a solid skeletal network in contact with a continuous liquid phase. Drying the gel to a thin layer produces coating 14 of the present invention.

A sol suitable for creating coating 14 is produced from reaction of a sol precursor. A sol precursor is a compound or mixture of compounds that react in solution to produce a sol. The sol precursor may be a metalorganic compound. A metalorganic compound includes a polyvalent metal atom attached to a hydrolyzable organic ligand, frequently through an oxygen-carbon linkage, such as is found in a metal alkoxide or a metal carboxylate. An alkoxide is optionally saturated or unsaturated, and optionally further substituted. Suitable alkoxide ligands include methoxy, ethoxy, propoxy, butoxy, pentoxy, and hexoxy moieties, or substituted or unsubstituted aryloxy groups. Metal alkoxides suitable as sol precursors may be monomeric, with the general formula $M(OR)_n$, where M is a polyvalent metal, OR is a hydrolyzable organic group, such as an alkoxide, and n is the valency of M and is from 2 to 8, depending on the valency of the metal. In addition, sol precursors may be oligomeric or polymeric metal alkoxides and/or carboxylates with two or more metals linked by one or more oxygen atoms and including alkoxide or carboxylate ligands. Alternatively, sol precursors may be metalorganic compounds of the general form $R^1{}_k\text{—}M\text{—}(OR)_{n-k}$, where $R^1$ is a non-hydrolyzable organic group, n is the valency of metal M, and OR represents a hydrolyzable organic group. This organic-containing sol-precursor may be oligomeric or polymeric with two or more metals linked by one or more oxygen atoms.

In one aspect, sol-gel processing creates coating 14 from a metal alkoxide that includes silicon. In another preferred embodiment sol-gel processing provides coating 14 from a metal alkoxide that includes aluminum. A more preferred embodiment provides coating 14 through sol-gel processing of a metal alkoxide that includes silicon and aluminum. In an even more preferred embodiment a sol precursor is used to create coating 14 that includes silicon and aluminum, and ligands of ethoxide and butoxide. A suitable copolymer for use in the preferred embodiment is diethoxysiloxane-s-butylaluminate, which is available from Gelest, Inc. of Tullytown, Pa.

Alternatively, the sol precursor may be selected from other hydrolyzable metal compounds that are not metalorganics. For example, the sol precursor may be $M(NO_3)_n$ or $M(Cl)_n$, where n is the valency of polyvalent metal M.

Coating 14 may be formed by sol-gel processing of a sol precursor compound into a sol and then to a gel. Typically, this sol-gel conversion occurs through hydrolysis and condensation. Reactive metal ligands may be replaced with hydroxyl groups that condense to produce metal-oxygen-metal linkages. In most cases, conversion of metal alkoxides in this process is catalyzed by the addition of water and releases an alcohol.

In a typical embodiment of the invention, a sol is produced from a metalorganic sol precursor. The sol is applied to a high transmissivity membrane and then converted to a gel. Although any suitable conditions may be used to promote the conversion of a sol precursor to a sol and then to a gel, a preferred embodiment employs water at a weight percent of about 0.5% to about 25%. A more preferred embodiment of the invention uses water at a weight percent of about 1% to about 10%, with an even more preferred water concentration of about 2.5% to about 7.5%.

Water and a metalorganic sol precursor may be mixed in a suitable organic solvent or solvent mixture. However, in preferred embodiments, water and a sol precursor are placed in a mixture including an alcohol. In more preferred embodiments, the alcohol includes 1 to 4 carbons. In even more preferred embodiments, the alcohol includes ethanol or isopropanol.

For application to a pellicle membrane, a sol is provided in a mixture at a concentration effective for conversion to a suitable gel. In preferred embodiments, the sol is included at a concentration of about 1% to about 25% by weight. In more preferred embodiments, the sol is included at about 2% to about 15%, and in even more preferred embodiments, the sol is included at about 5% to about 10% by weight.

The sol mixture is applied to one or both surfaces of membrane 12 in a substantially uniform layer by any suitable application method. Examples of suitable application methods may include spin casting, doctor blading, dip coating, horizontal flow, and spraying. In a preferred embodiment, spin casting is used. Spin casting may allow the thickness of the applied sol mixture to be regulated by adjusting the rate of spinning and the viscosity of the sol mixture.

In a typical embodiment, the sol is substantially converted to a gel after the sol mixture has been applied to membrane 12. This order of events is dictated by practical considerations: during conversion of a sol to a gel, the viscosity of the mixture increases dramatically. However, it is important to note that the two step sol-gel process may have poorly defined boundaries. For example, the sol mixture used to coat membrane 12 may include some gel-like linkages, as long as the sol mixture has a sufficiently low viscosity to be applied uniformly to membrane 12.

In some embodiments, membrane 12 is heated subsequent to applying the sol to the membrane. This may serve at least three purposes. First, sol-gel processing may be accelerated at a higher temperature by an increased rate of reaction. Second, heat may be used to promote conversion of a gel to a coating through an increased rate of solvent evaporation. Third, solvent evaporation increases the concentration of the sol and thus may increase the rate of reaction. Although sol-gel processing and coating formation may be carried out at room temperature, at about 15° C. to about 25° C., the process may be accelerated by exposing the membrane-sol or -gel combination to an elevated temperature. Suitable elevated temperatures may include about 25° C. to about 200° C., about 50° C. to about 150° C., or about 80° C. to about 120° C. The duration of exposure of the sol and/or gel to elevated temperature may be inversely related to the extent of temperature elevation. For example, at a higher temperature, both the sol to gel conversion and solvent removal may be accelerated more than at a lower temperature. Exposure to elevated temperature may be for about 10 minutes to about 600 minutes, about 20 minutes to about 150 minutes, or about 30 minutes to about 70 minutes.

EXAMPLE 1

The following is an example of a method for producing an electrically conductive coating on an optical pellicle. A copolymer of diethoxysiloxane-s-butylaluminate is obtained from Gelest, Inc., Tullytown, Pa. as a liquid that is >90% copolymer, <5% ethanol, and <5% s-butanol. This copolymer has a molecular weight of about 300–450 and is substantially a dimer produced by condensation of tetraethoxysilane and tri-sbutoxyaluminate. The copolymer is diluted in isopropanol to a final concentration of about 7.5% by weight. Water is added to a final concentration of 5% by weight and the solution becomes cloudy as the copolymer polymerizes to a sol, thus providing a sol mixture.

The sol mixture is spin coated onto a fluoropolymer membrane of 0.9 $\mu$m produced from TEFLON AF-1600 obtained from DuPont Chemicals. Subsequent to coating, the coated membrane is heated to 100° C. for fifty minutes. This produces a coating with a thickness of 100 angstroms. After cooling, the coated membrane can function as an antistatic optical pellicle with high transmissivity and a volume resistivity low enough to reduce electrostatic discharge.

The disclosure set forth above encompasses multiple distinct inventions with independent utility. Although each of these inventions has been disclosed in its preferred form(s), the specific embodiments thereof as disclosed and illustrated herein are not to be considered in a limiting sense, because numerous variations are possible. The subject matter of the inventions includes all novel and nonobvious combinations and subcombinations of the various elements, features, functions, and/or properties disclosed herein. The following claims particularly point out certain combinations and subcombinations regarded as novel and nonobvious and directed to one of the inventions. These claims may refer to "an" element or "a first" element or the equivalent thereof; such claims should be understood to include incorporation of one or more such elements, neither requiring nor excluding two or more such elements. Inventions embodied in other combinations and subcombinations of features, functions, elements, and/or properties may be claimed through amendment of the present claims or through presentation of new claims in this or a related application. Such claims, whether directed to a different invention or to the same invention, and whether broader, narrower, equal, or different in scope to the original claims, also are regarded as included within the subject matter of the inventions of the present disclosure.

I claim:

1. An antistatic optical pellicle, comprising:
   a pellicle membrane substantially including a fluoropolymer and having a surface; and
   an electrically conductive thin coating disposed on the surface of the membrane, the membrane and the coating combined being highly transmissive to ultraviolet light at a wavelength of less than about 250 nm.

2. The pellicle of claim 1, where the coating has a thickness of about 20 to about 2000 angstroms.

3. The pellicle of claim 1, where the membrane has a thickness of about 0.5 $\mu$m to about 2 $\mu$m.

4. The pellicle of claim 3, where the coating has a thickness of about 20 to about 2000 angstroms.

5. The pellicle of claim 1, where the coating has a volume resistivity that is less than about $10^{16}$ $\Omega$-cm.

6. The pellicle of claim 1, where the coating substantially comprises a metal oxide.

7. The pellicle of claim 6, where the metal oxide includes at least one metal selected from the group consisting of Al, As, At, B, Be, Ce, Co, Cr, Cu, Er, Eu, Fe, Ge, In, Mg, Nb, Ni, Pd, Po, Pr, Rb, Sb, Si, Sn, Sr, Ta, Te, Th, Ti, U, V, W, Y, Zn, and Zr.

8. The pellicle of claim 6, where the metal oxide includes Al, Ce, Si, Ti, or Zr.

9. The pellicle of claim 6, where the metal oxide includes Si and Al.

10. The pellicle of claim 1, further comprising a frame that supports the membrane in spaced relation to a planar surface.

11. An antistatic optical pellicle, comprising:
    a pellicle membrane substantially including a fluoropolymer and having a surface; and
    an electrically conductive thin coating disposed on the surface by sol-gel processing, the membrane and the coating combined being highly transmissive to ultraviolet light at a wavelength of less than about 250 nm.

12. The pellicle of claim 11, where the sol-gel processing comprises a sol precursor that includes at least one metal selected from the group consisting of Al, As, At, B, Be, Ce, Co, Cr, Cu, Er, Eu, Fe, Ge, In, Mg, Nb, Ni, Pd, Po, Pr, Rb, Sb, Si, Sn, Sr, Ta, Te, Th, Ti, U, V, W, Y, Zn, and Zr.

13. The pellicle of claim 11, where the sol-gel processing comprises a sol precursor that includes at least one metal selected from the group consisting of Al, Ce, Si, Ti, and Zr.

14. The pellicle of claim 11, where the sol-gel processing comprises a sol precursor that includes Al and Si.

15. The pellicle of claim 11, where the sol-gel processing includes a metalorganic compound.

16. The pellicle of claim 15, where the metalorganic compound is a metal alkoxide.

17. The pellicle of claim 16, where the alkoxide has 1 to 6 carbons.

18. The pellicle of claim 16, where the metal alkoxide is diethoxysiloxane-s-butylaluminate.

19. A method of coating an optical pellicle, comprising the steps of:
    applying a sol to a surface of a pellicle membrane so as to form a gel on the surface, the membrane substantially including a fluoropolymer; and
    drying the gel to form an electrically conductive coating on the surface of the membrane, the membrane and the coating combined being highly transmissive to ultraviolet light at a wavelength of less than about 250 nm.

20. The method of claim 19, where the sol includes a metal selected from the group consisting of Al, As, At, B, Be, Ce, Co, Cr, Cu, Er, Eu, Fe, Ge, In, Mg, Nb, Ni, Pd, Po, Pr, Rb, Sb, Si, Sn, Sr, Ta, Te, Th, Ti, U, V, W, Y, Zn and Zr.

21. The method of claim 19, where the sol includes a metal selected from the group consisting of Al, Ce, Si, Ti, and Zr.

22. The method of claim 19, where the sol includes Al and Si.

23. The method of claim 19, where the electrically conductive coating is a metal oxide.

24. The method of claim 19, where the sol is prepared from a metal alkoxide sol precursor.

25. The method of claim 24, where the sol precursor includes aluminum or silicon.

26. The method of claim 19, where drying includes heating the gel.

27. The method of claim 19, where applying includes spin casting.

28. An antistatic optical pellicle, comprising:
a pellicle membrane substantially including a fluoropolymer and having a surface, the membrane being highly transmissive to ultraviolet light at a wavelength of less than about 250 nm; and
an electrically conductive thin coating attached to the membrane at the surface.

29. The pellicle of claim 28, where the coating substantially comprises a metal oxide.

30. The pellicle of claim 29, where the metal oxide includes at least one of Al, Ce, Si, Ti, and Zr.

31. The pellicle of claim 28, where the coating has a thickness of about 20 to about 2000 angstroms.

32. The pellicle of claim 28, further comprising a frame configured to support the membrane in spaced relation to a planar surface.

33. The pellicle of claim 28, the coating being produced by sol-gel processing.

* * * * *